United States Patent
Farrell et al.

(10) Patent No.: US 6,952,046 B2
(45) Date of Patent: Oct. 4, 2005

(54) ELECTRONIC AND OPTOELECTRONIC COMPONENT PACKAGING TECHNIQUE

(75) Inventors: Brian Farrell, Quincy, MA (US); Paul Jaynes, Attleboro, MA (US); Malcolm Taylor, Pepperell, MA (US)

(73) Assignee: Foster-Miller, Inc., Waltham, MA (US)

(*) Notice: Subject to any disclaimer, the term of this patent is extended or adjusted under 35 U.S.C. 154(b) by 0 days.

(21) Appl. No.: 10/460,852

(22) Filed: Jun. 13, 2003

(65) Prior Publication Data

US 2004/0012083 A1 Jan. 22, 2004

Related U.S. Application Data

(60) Provisional application No. 60/390,011, filed on Jun. 19, 2002.

(51) Int. Cl.[7] .............................................. H01L 23/02
(52) U.S. Cl. ..................... 257/678; 257/704; 257/723; 361/535
(58) Field of Search ............................... 257/678, 723, 257/704; 361/517, 535

(56) References Cited

U.S. PATENT DOCUMENTS 4,370,515 A    1/1983   Donaldson
5,144,412 A    9/1992   Chang et al.
5,369,552 A  * 11/1994   Barnes et al. ............... 361/816

(Continued)

OTHER PUBLICATIONS

U.S. Appl. No. 10/460,942, filed Jun. 13, 2002, Farrell et al.

Kumaraswamy Jayaraj, B. Farrell, "*Liquid Crystal Polymers and Their Role in Electronic Packaging*", Advancing Microelectronics, Jul./Aug. 1998, pp. 15–18.

T. Noll, K. Jayaraj, B. Farrell, and R. Larmouth, "*Low–Cost, Near–Hermetic Multichip Module Based on Liquid Crystal Polymer Dielectrics*", Proceedings of the International Conference on Multichip Modules, 1996, Denver, Colorado, pp. 1–6.

Primary Examiner—Jasmine Clark
(74) Attorney, Agent, or Firm—Iandiorio & Teska

(57) ABSTRACT

A package including a substrate, a plurality of components on the substrate, and a lid assembly including a plurality of integrated covers for at least select components on the substrate. A method of manufacturing such a lid assembly is also disclosed as is a packaging method.

48 Claims, 14 Drawing Sheets

U.S. PATENT DOCUMENTS

| | | | |
|---|---|---|---|
| 5,418,329 A | | 5/1995 | Katoh et al. |
| 5,471,011 A | | 11/1995 | Maslakow |
| 5,480,840 A | | 1/1996 | Barnes et al. |
| 5,483,740 A | | 1/1996 | Maslakow |
| 5,644,473 A | * | 7/1997 | Derouiche .................. 361/732 |
| 5,650,593 A | | 7/1997 | McMillan et al. |
| 5,694,300 A | | 12/1997 | Mattei et al. |
| 5,761,053 A | | 6/1998 | King et al. |
| 5,790,381 A | * | 8/1998 | Derouiche et al. .......... 361/735 |
| 5,827,999 A | | 10/1998 | McMillan et al. |
| 5,893,959 A | | 4/1999 | Muellich |
| 6,057,597 A | | 5/2000 | Farnworth et al. |
| 6,088,237 A | * | 7/2000 | Farnworth et al. .......... 361/796 |
| 6,136,128 A | | 10/2000 | Chung |
| 6,320,257 B1 | | 11/2001 | Jayaraj et al. |
| 6,403,211 B1 | | 6/2002 | Yang et al. |
| 6,428,650 B1 | | 8/2002 | Chung |
| 6,437,435 B1 | * | 8/2002 | Kinsman et al. ............ 257/693 |
| 6,489,178 B2 | | 12/2002 | Coyle et al. |
| 6,501,654 B2 | | 12/2002 | O'Connor et al. |
| 6,534,338 B1 | * | 3/2003 | Schoonejongen et al. ... 438/107 |
| 6,538,211 B2 | | 3/2003 | St. Lawrence et al. |
| 6,617,686 B2 | | 9/2003 | Davies |
| 6,621,161 B2 | * | 9/2003 | Miyawaki ................... 257/723 |
| 6,627,987 B1 | * | 9/2003 | Glenn et al. ................ 257/704 |
| 6,770,158 B2 | | 8/2004 | Hartley et al. |
| 2001/0019475 A1 | | 9/2001 | Kimura et al. |
| 2002/0187570 A1 | | 12/2002 | Fukasawa et al. |
| 2002/0197026 A1 | | 12/2002 | Kato et al. |
| 2003/0002265 A1 | | 1/2003 | Simmons |
| 2003/0026556 A1 | | 2/2003 | Mazotti et al. |
| 2003/0044130 A1 | | 3/2003 | Crane, Jr. et al. |
| 2003/0045024 A1 | | 3/2003 | Shimoto et al. |
| 2003/0057535 A1 | | 3/2003 | Nguyen et al. |
| 2004/0056006 A1 | | 3/2004 | Jones et al. |

\* cited by examiner

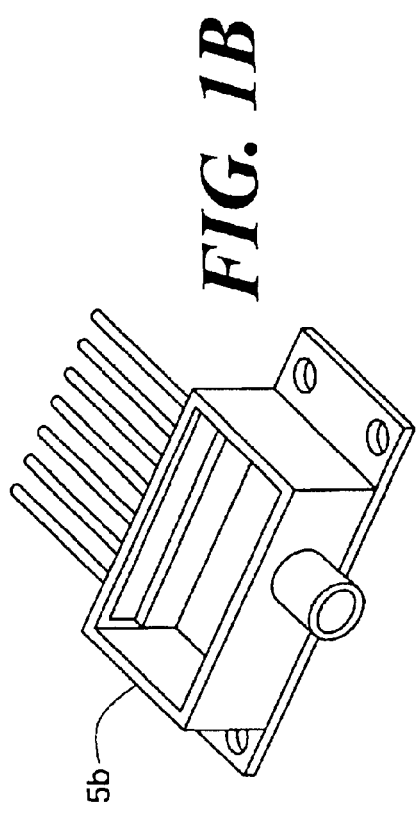
FIG. 1A
FIG. 1B
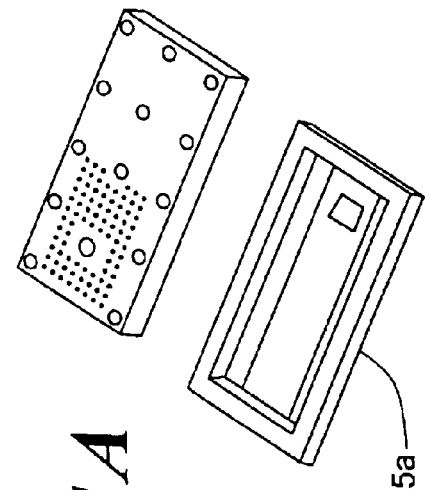
FIG. 1C
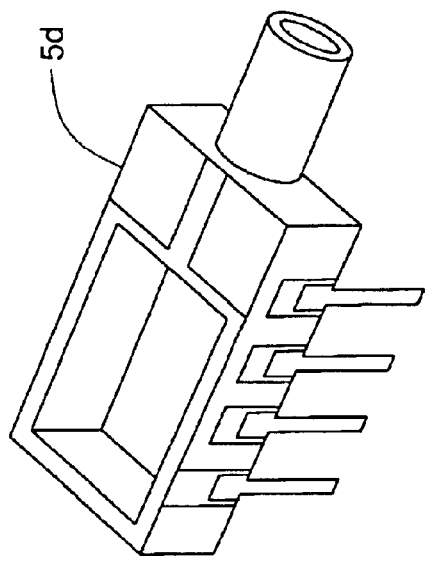
FIG. 1D
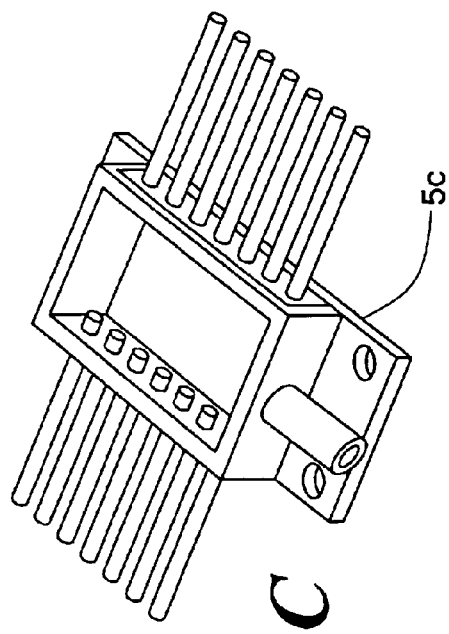

ELECTRONIC AND OPTOELECTRONIC COMPONENT PACKAGING TECHNIQUE

RELATED APPLICATIONS

This application claims the benefit of priority to provisional application Ser. No. 60/390,011 filed Jun. 19, 2002. This invention was made with U.S. Government support under Contract No. DAAH01-00-C-R070 awarded by the U.S. Army. The Government may have certain rights in the subject invention.

FIELD OF THE INVENTION

This invention relates to an electronic and optoelectronic component package, a unique lid assembly, and several useful package sealing techniques.

BACKGROUND OF THE INVENTION

Semi-conductor packaging is an active field. U.S. Pat. No. 5,827,999, incorporated herein by this reference, delineates the limitations associated with numerous prior art packaging techniques including encasement, the cavity package, and various thermoplastic chip carrier packages. The basic purpose of any semi-conductor package is protection of the component(s) (e.g., electronic chips, electrooptical devices, and the like) housed by the package while at the same time providing electrical and/or optical interconnections from the component(s) through the package. Manufacturability and protection are key concerns. The applicant owns U.S. Pat. No. 6,320,257 disclosing a semiconductor packaging technique comprising an interconnect substrate including at least one layer of LCP material, at least one semiconductor component bonded to the substrate, a lid, and a hermetic seal sealing the lid to the substrate. This patent is hereby incorporated herein by this reference. The '999 patent discloses the idea of molding a casing onto the circuit substrate around a chip. The casing can be made of, among other things, liquid crystal polymer material. As recognized by the inventors hereof, LCP materials have a very low moisture permeability and can provide a hermetic seal especially if the package lid covering the chip and also the substrate which supports the chip are both made of LCP or even if the lid assembly is composed of a metal, ceramic, or glass. Other relevant art includes U.S. Pat. Nos. 6,403,211; 6,538,211; 6,057,597; 6,428,650; 6,136,128; 5,761,053; 6,501,654; and 5,471,011; and patent Publication Nos. U.S. 2003/0,002,265; U.S. 2002/0,187,570; U.S. 2001/0,019,475; U.S. 2003/0,026,556; U.S. 2003/0,044,130; U.S. 2002/0,197,026; U.S. 2003/0,057,535; and U.S. 2003/0,045,024.

This art, however, is not primarily concerned with manufacturability. In most, if not all cases, a single component is mounted to a circuit substrate and then the lid or cover is secured over the component to the substrate. Assembly of the components as single entities consumes unnecessary time, effort, and cost in the component assembly process. Also, the art listed above is not primarily concerned with feasibility studies to ascertain the most economical methods of sealing the cover over the component to the substrate.

BRIEF SUMMARY OF THE INVENTION

It is therefore an object of this invention to provide a highly efficient package lid and substrate assembly process.

It is a further object of this invention to provide such a process which results in precision alignment of the package lids to the interconnect substrate.

It is a further object of this invention to provide such a process which is versatile and can accommodate many different types of components, substrate designs, cover designs, and sealing processes.

It is a further object of this invention to provide a novel semi-conductor package lid sub-assembly.

It is a further object of this invention to provide new ways of efficiently and effectively sealing the cover over the component(s) to the substrate.

This invention results from the realization that a highly effective package lid and assembly process is effected by injection molding a number of individual covers as an integrated lid sub-assembly, mating a populated interconnect substrate with the integrated lid sub-assembly, and then singulating the individual packages. Sealing the individual covers over a component to the substrate can be accomplished before singulation or even after singulation using a variety of different efficient methods.

This invention features a package comprising a substrate, a plurality of components on the substrate, and a lid assembly including a plurality of integrated covers for at least select components on the substrate.

In one example, the lid assembly includes a plurality of integral alignment pins and the substrate includes alignment holes which receive the alignment pins to position the covers with respect to the components. Typically, the pins are made of meltable material and the covers are spaced from each other and the alignment pins are positioned in the spaces between the covers.

In one embodiment, the substrate is formed of at least one layer of a liquid crystal polymer material. The liquid crystal polymer material may be bi-axially oriented. In one example, the substrate is a printed circuit board and there is a cover for each component on the substrate. Then, the covers are formed in an array and extend outward from an interconnecting layer. Preferably, the lid assembly is formed of a liquid crystal polymer material.

Also, there is a seal between each cover and the substrate such as a laser welded seal, or an ultrasonically created seal. A susceptor material may be placed between the covers and the substrate to absorb laser energy when the covers are laser welded to the substrate. The substrate may include pigmentation to absorb laser energy when the covers are laser welded to the substrate or the covers may include pigmentation to absorb laser energy when the covers are laser welded to the substrate. The covers may include energy directors for focusing ultrasonic energy when the covers are ultrasonically welded to the substrate. In one example, the substrate includes cavities formed therein which received the energy directors of the covers.

Typically, each cover includes sidewalls and a cap. There may be four sidewalls. Also, the lid assembly may further include a layer interconnecting the caps of each cover which can be removed to singulate the individual covers. In one embodiment, the cap includes an optical window sealed to the cap by a laser. Preferably, the sidewalls include a lower lip. And, in one example, each cover includes sidewalls each terminating in a lip, the lips co-joined by an interconnecting layer.

This invention also features a packaging method comprising assembling components on a substrate, manufacturing a lid assembly to include a plurality of integrated covers, and mating the lid assembly to the substrate.

In one embodiment, the substrate includes alignment holes and manufacturing includes forming alignment pins extending from the lid assembly which are received in the alignment holes of the substrate to position the lid assembly covers with respect to the components. Further included may be the step of melting the pins to secure the lid assembly to the substrate. Typically, the individual covers are singulated. Manufacturing may include forming a layer interconnecting the covers and singulation includes removing the interconnecting layer. Or, manufacturing may include forming a layer interconnecting the covers and singulation includes cutting through the interconnecting layer between the individual covers. Cutting further may further include cutting the substrate between the individual covers.

In one example, manufacturing includes injection molding spaced covers to each include sidewalls and a cap, the caps of all the covers interconnected by an interconnecting layer. Mating may include adding a bonding agent between the end of each cover sidewall and the substrate. Typically, the substrate is formed of at least one layer of a liquid crystal polymer material. In one example, the liquid crystal polymer material is bi-axially oriented. In one embodiment, the substrate is a printed circuit board and there is a cover for each component on the substrate. In one example, the covers are formed in an array and extend outward from an interconnecting layer. Further included may be the step of sealing each cover with respect to the substrate. Sealing includes laser welding. A susceptor material may be disposed between the covers and the substrate to absorb laser energy when the covers are laser welded to the substrate. Also, pigmentation can be added to the substrate to absorb laser energy. Or, pigmentation can be added to the covers to absorb laser energy. In another example, sealing includes ultrasonically welding each cover to the substrate. In this example, energy directors may be formed in the covers for focusing the ultrasonic energy and cavities may be formed in the substrate to receive the energy directors. Typically, a lower lip is formed for each cover. In one embodiment, the lips of all covers are co-joined by an interconnecting layer.

A lid assembly in accordance with this invention includes a plurality of covers each including sidewalls and a cap and an interconnecting layer which integrates the covers for placement in unison over components on a substrate. Typically, the covers and the interconnecting layer are formed of a liquid crystal polymer material by injection molding. In one example, the interconnecting layer is a continuous layer spanning the caps of all the covers. In another example, the sidewalls include a lower lip portion and the interconnecting layer co-joins the lower lip portions of the covers.

One package in accordance with this invention includes a substrate made of LCP material, a plurality of components on the substrate, and a lid assembly including a plurality of integrated covers all made of LCP material and secured to the substrate, each cover disposed over a component.

BRIEF DESCRIPTION OF THE DRAWINGS

Other objects, features and advantages will occur to those skilled in the art from the following description of a preferred embodiment and the accompanying drawings, in which:

FIGS. 1A–1D are schematic three-dimensional views showing various conventional package designs useful in connection with optoelectric components;

DISCLOSURE OF THE PREFERRED EMBODIMENT

Figure 2:
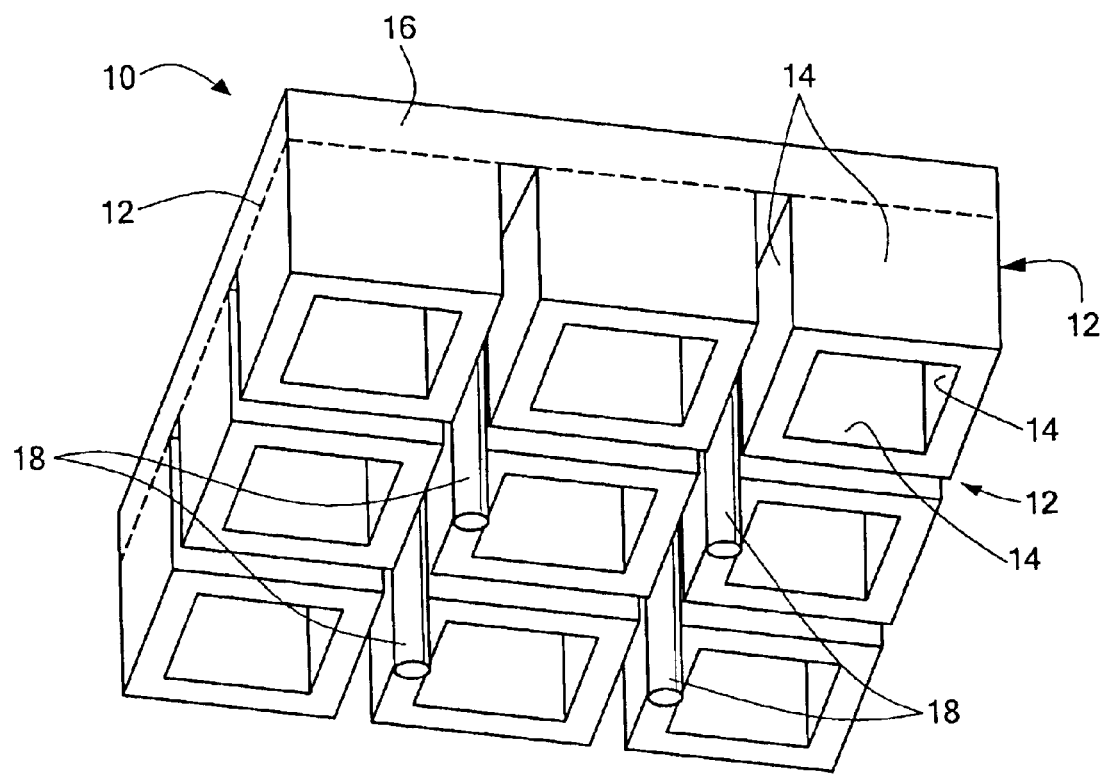
FIG. 2 is a schematic three-dimensional bottom view showing, in one example, a lid sub-assembly in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

FIGS. 1A–1D show typical packages 5A–5D for optoelectronic components. One goal of the subject invention is to provide packages for optoelectronic and other components which are more efficiently manufactured and assembled thus reducing costs.

Figure 4:
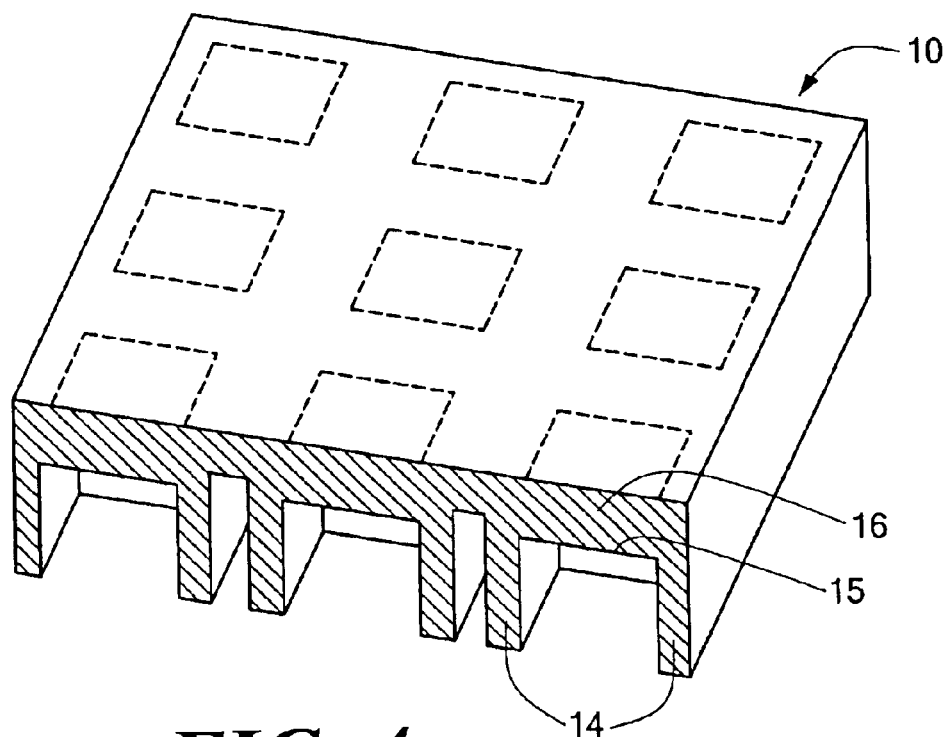
FIG. 4 is a schematic three-dimensional partial cross-sectional view of the lid sub-assembly shown in FIG. 1.

FIG. 2 shows, in one example of the subject invention, lid assembly 10 which includes an array of individual covers 12 each cover including, typically, four side walls 14 and a covering cap or top 15 (see FIG. 4). Interconnecting layer 16, FIGS. 1 and 4, in this embodiment, a continuous plate which integrates covers 12 for placement in unison over multiple components on a substrate. Lid assembly 10 is typically molded from filled LCP material (e.g., 30% glass filler) and may even include multi-axially oriented material as discussed in the applicant's U.S. Pat. No. 6,320,257 herein incorporated by this reference. The use of LCP in place of other thermoplastic polymers is preferred because LCP exhibits superior barrier properties, high use temperature, and dimensional stability for precision molding tolerances. Other thermoplastics, other materials, and other forming processes, however, may also be used.

Figure 3:
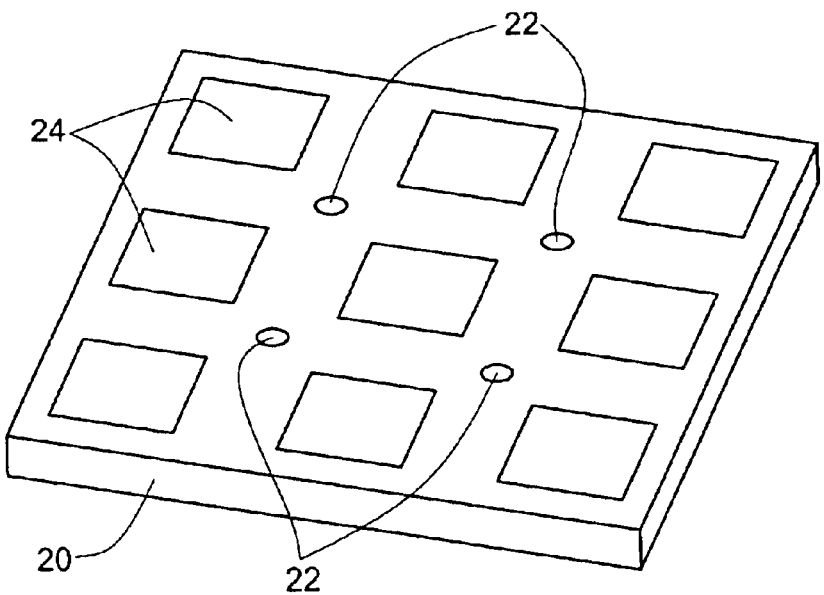
FIG. 3 is a schematic three-dimensional view showing a printed circuit board substrate before it is populated with components.
Figure 5:
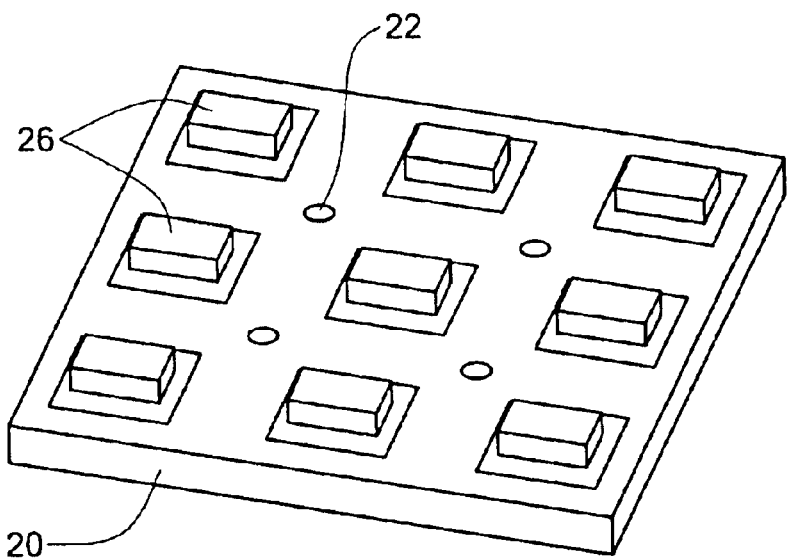
FIG. 5 is a schematic three-dimensional view showing the printed circuit board substrate of FIG. 2 now populated with components.
Figure 6:
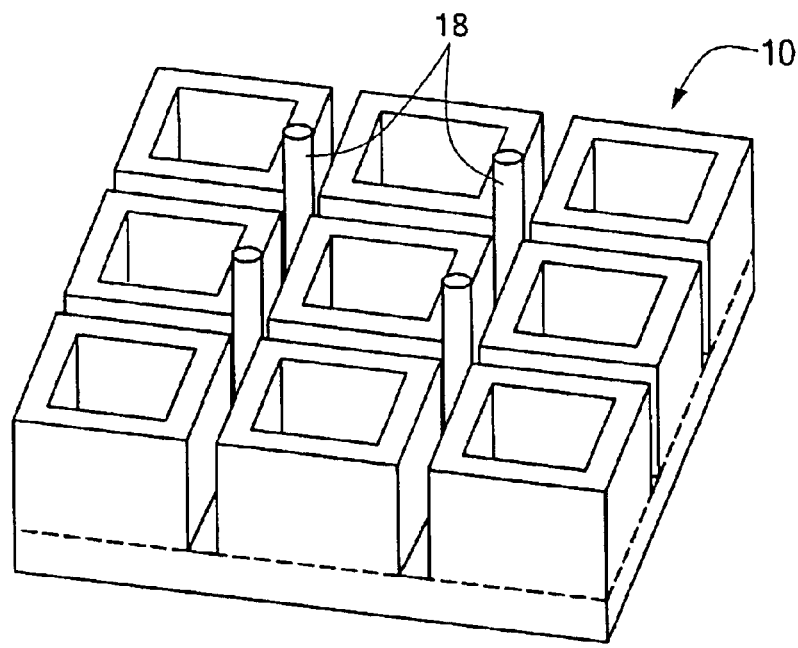
FIG. 6 is another schematic three-dimensional view showing one example of a lid sub-assembly in accordance with the subject invention.
Figure 7:
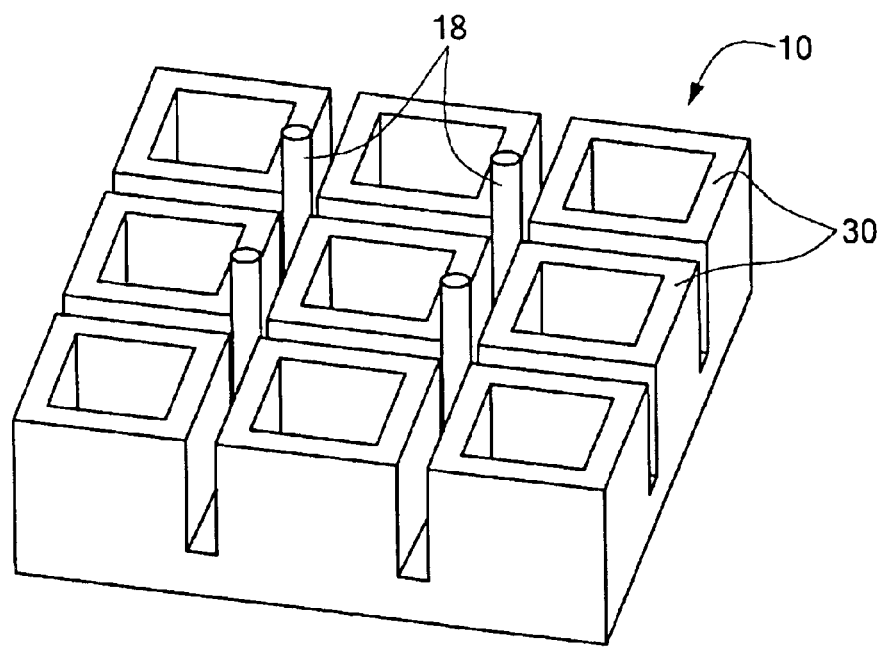
FIG. 7 is a schematic three-dimensional view of the lid sub-assembly of FIG. 6 with a susceptor compound now in place on the bottoms of the individual covers.

In one preferred embodiment, alignment pins 18, also made of LCP material, extend outward from the molded interconnecting layer 16 in the spaces between the covers. Then, chip circuit board substrate 20, FIG. 3 includes corresponding alignment holes 22. Substrate 20 typically includes at least one layer, preferably the top layer, of multi-axially oriented LCP material as set forth in U.S. Pat. No. 6,320,257 (see FIGS. 2b and 3 thereof). Thus, substrate 20, typically a printed circuit board, can accommodate a wide variety of different types of components (chips, optical devices, MEMs devices, and the like) and also accommodates a number of different chip mounting technologies (wire bonding, ball grid arrays, surface mount technology, and the like). Areas 24 on substrate 20 are dedicated to the components 26 as shown in FIG. 5.

Figure 8:
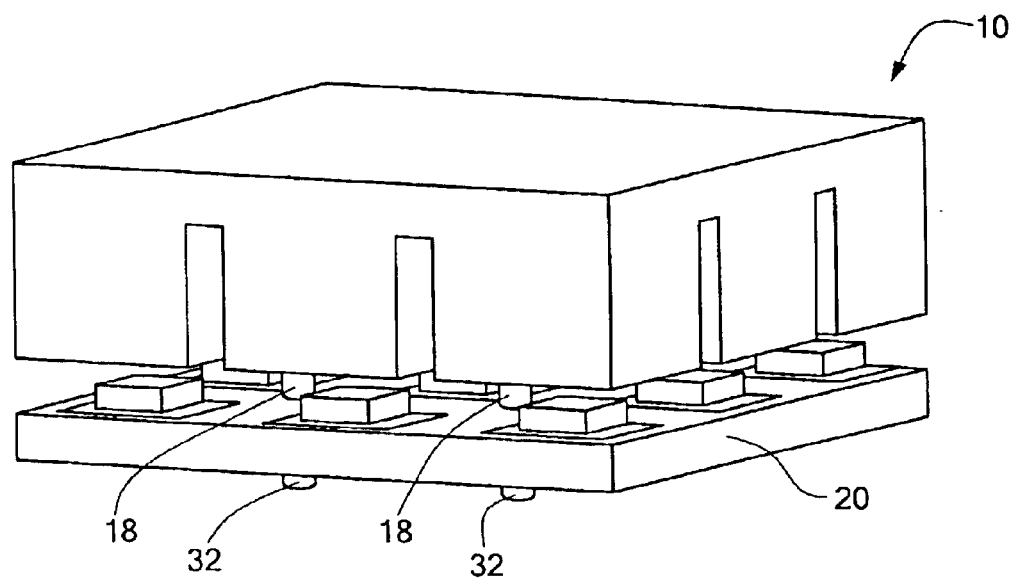
FIG. 8 is a schematic three-dimensional view showing the lid sub-assembly of FIG. 7 being mated to the populated circuit board substrate using the alignment pins of the subject invention.
Figure 9:
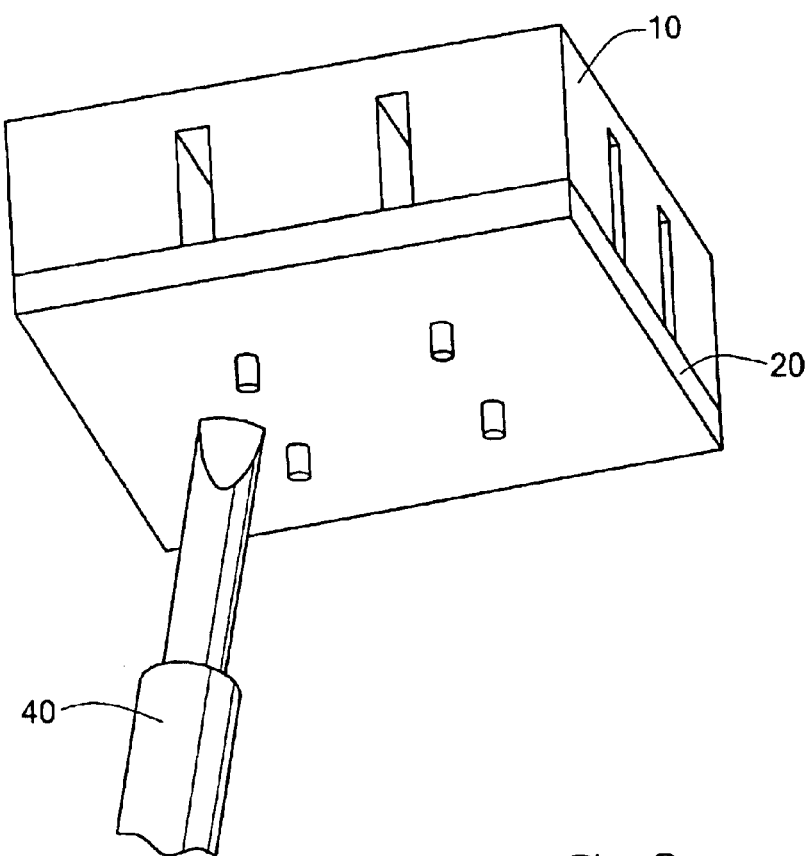
FIG. 9 is a schematic three-dimensional view showing how, in one embodiment, the alignment pins of the lid sub-assembly are melted to the substrate to secure the lid subassembly in place on the substrate.

In one example, a bonding agent; an adhesive, and/or a susceptor (e.g., Clearweld™) material 30, FIG. 2 may be dispensed (e.g., screened) onto the distal end of each sidewall, or onto the mating surface on the substrate, before lid assembly 10 is mated to the populated substrate 20, FIG. 8 as the alignment pins 18 are received in the alignment holes as shown at 32. Next, ultrasonic horn 40, FIG. 9 can be used to melt the distal ends of the alignment pins to secure lid assembly 10 to substrate 20. Melting/welding of the alignment pins is not a necessary step as the subsequent lid sealing process can form a sufficient mechanical bond of the lid to the substrate. Each cover may also be hermetically sealed to substrate 20 at this stage in the assembly process using one or more of the techniques discussed below. Each cover is typically associated with one component but a cover may also be disposed over multiple components.

Figure 10:
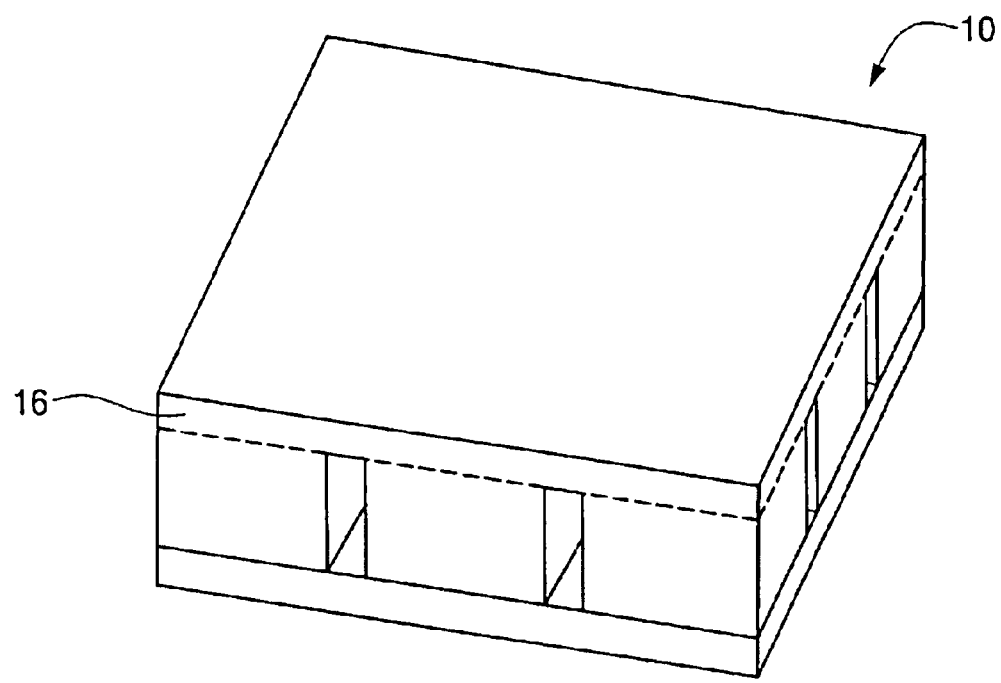
FIG. 10 is a schematic three-dimensional view showing the lid sub-assembly now mated to the substrate in accordance with the subject invention just before singulation.
Figure 11:
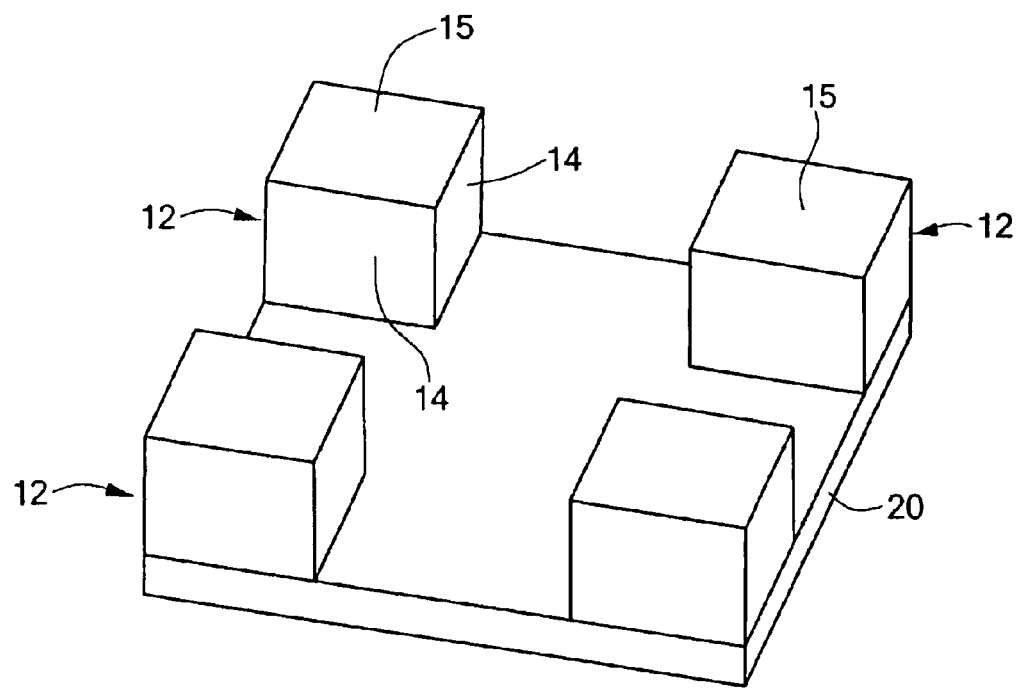
FIG. 11 is a schematic three-dimensional view showing the individual covers after singulation in accordance with one embodiment of the subject invention.

Singulation can be carried out in a number of different ways. In FIG. 10, integration layer 16 is removed by back lapping, for example, to separate each cover 12, FIG. 11. Then, substrate 20 is singulated in one process step using conventional techniques. Or, in other embodiments, substrate 20 may be left intact.

Figure 12:
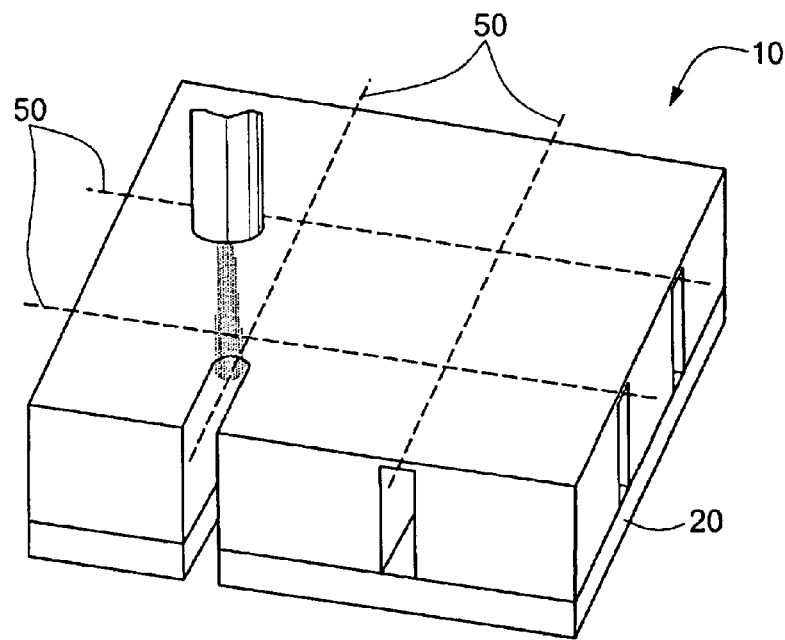
FIG. 12 is a schematic three-dimensional view showing singulation of the covers and the substrate at the same time in accordance with the another embodiment of the subject invention.

Alternatively, singulation of both the covers and substrate 20, FIG. 12 can be accomplished by cutting through both integration layer 16 and substrate 20 as shown in FIG. 12 along lines 50 using (a routing tool, laser, water jet, or other cutting apparatus). If the lid assembly and the substrate are manufactured in a certain way, the modules may be snapped apart rather than cut apart. For vibration or shock sensitive components this may not be feasible, but in some cases a snap-singulation may be practical. The substrate would have to be embossed, etched, or scribed to snap along a line and the mating lid assemble would also have to include a snap line.

Figure 13:
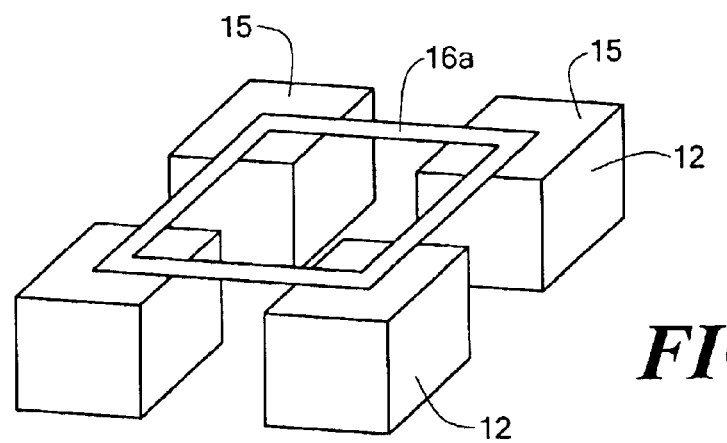
FIG. 13 is a schematic three-dimensional view showing another type of lid sub-assembly interconnection layer in accordance with the subject invention.

FIG. 13 shows a different kind of interconnecting layer 16a spanning the tops 15 of each cover 12. The interconnection part of the lids depicted in FIG. 13 may be the runners used to injection mold the lid assembly. Again, this whole package lid sub-assembly can be molded in the form shown in FIG. 13. Covers 12 are singulated by removing layer 16a and/or cutting through it in the areas between the individual covers.

Figure 14:
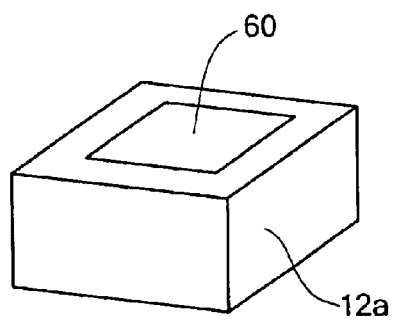
FIG. 14 is a schematic three-dimensional view showing another type of cover in accordance with the subject invention including an optical window.
Figure 15:
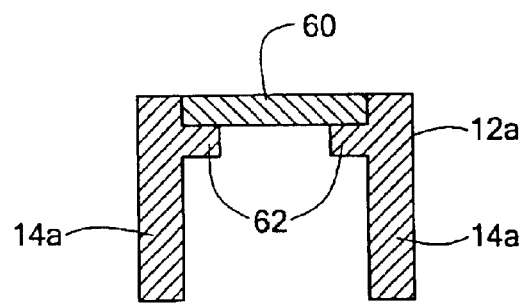
FIG. 15 is a schematic cross-sectional view of the optical window type cover of FIG. 14.

FIGS. 14–15 show a different type of cover 12a including optical window 60 useful when the component housed in cover 12a is an optical device. Walls 14a of cover 12a include ledge 62 which supports optical window 60. Window 60 may be laser welded in place on ledges 62. The optical window 60 may be made of a number of optical materials formed into a number of shapes (e.g., flat optical window, collimating lens, micro-lens arrays, and the like).

Figure 16:
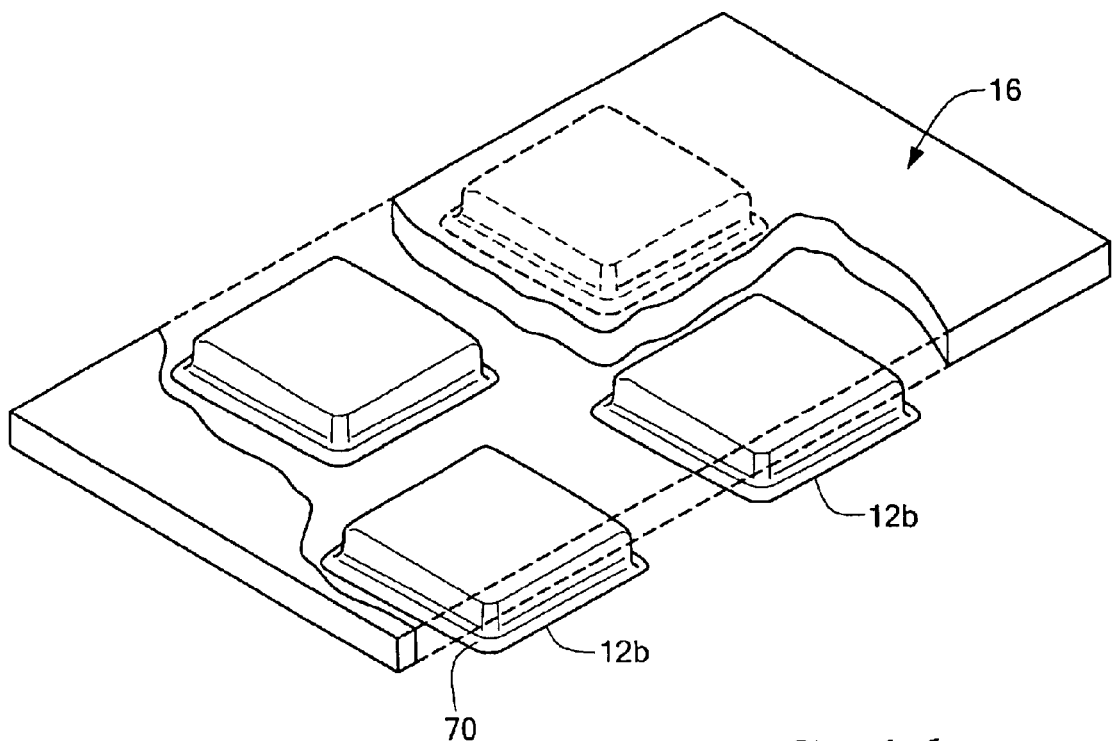
FIG. 16 is a schematic view showing an array of covers each including a lower lip portion in accordance with the subject invention.

FIG. 16 shows alternative covers 12b extending outward from integration layer 16 each including lower lip 70 useful, as described below, for securing the covers to a substrate using a variety of different sealing processes in accordance with the subject invention and interconnected by a bulk of injection molded material. This formation of the lid assembly can be locked in place or sealed and then backlapped to singulate the lids.

Figure 17:
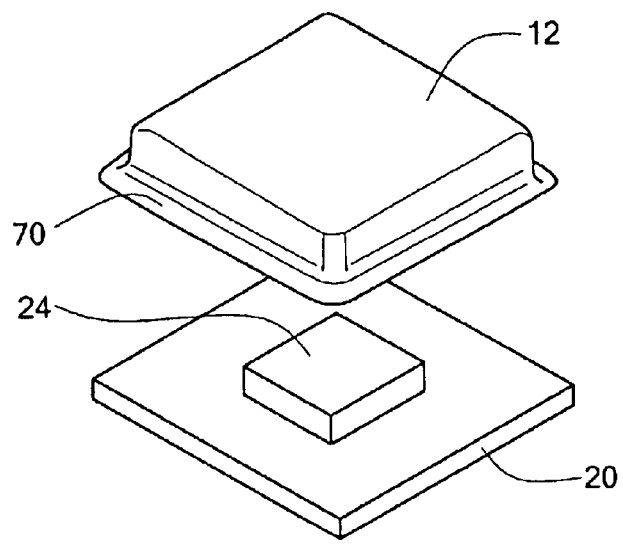
FIG. 17 is a schematic view showing a single cover of the array of covers shown in FIG. 16 just before it is sealed over a component and onto the substrate.

The subject invention also includes a wide variety of methods for hermetically sealing lip 70, FIG. 17 of cover 12 over component 24 on substrate 20 either after cover 12 is singulated as shown in FIG. 17 or even before cover 12 is singulated (i.e. when cover 12 is still interconnected to a number of similarly constructed covers). Typically, cover 12 is injection molded out of a filled LCP material and substrate 20 is made of or includes bi-axially oriented LCP material.

Figure 18:
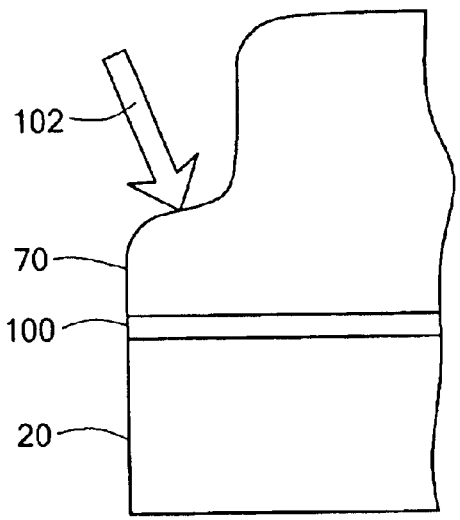
FIG. 18 is a schematic partial cross-sectional view showing how the lower lip assembly of a single cover is sealed with respect to the substrate in accordance with one embodiment of the subject invention.

LCP material is somewhat transparent to near-infrared radiation. Thus, in one example, susceptor material 100, FIG. 18 (e.g., Clearweld™, or an alternative IR absorbing material) is placed between lower lip 70 of the cover and substrate 20 and infrared laser energy 102 is used to heat the interface between cover lip 70 and substrate 20 as the laser energy is absorbed by susceptor material 100. The result is localized heating which melts and seals the LCP material at the interface between lip 70 and substrate 20. The susceptor material may be printed, jetted, screened, or painted onto the lower lip of the cover and/or onto the substrate or even plated thereto. The thickness of lip 70 should be no greater than 32 mils to achieve proper heating and a hermetic seal.

Figure 19:
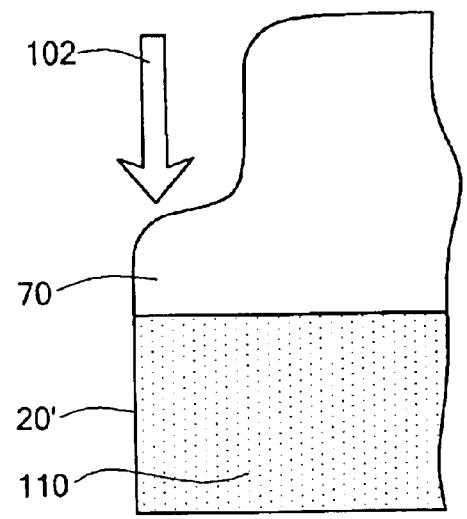
FIG. 19 is a schematic partial cross-sectional view showing another method of sealing a cover to a substrate.

In another example, the LCP material of at least the top layer of substrate 20', FIG. 19 is pigmented with, for example, carbon resin 110 prior to injection molding or extrusion of the material. When laser energy 102 hits the pigmented substrate after passing through lip 70, heat is generated at the contact point between lip 70 and substrate 20' and a hermetic seal is created. The thickness, width, and geometry of lower lip 70 all play a part in the sealing effectiveness and can be optimized for various different designs.

Figure 20:
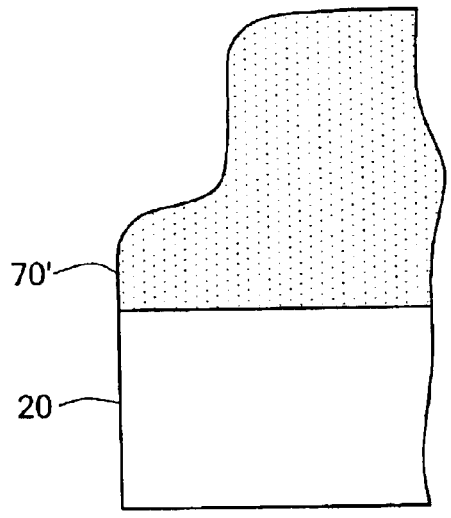
FIG. 20 is a schematic partial cross-sectional view showing still another method of sealing a cover to a substrate.

Another option is to pigment at least lip portion 70', FIG. 20 of the cover and direct laser energy 102 to lip portion 70' through substrate 20. Now, the thickness of substrate 20 should be in the 2 to 20 mil range. Pigmentation of the substrate (FIG. 19) or cover (FIG. 20) can be augmented with susceptor layer 100, FIG. 18. Standard diode laser welding systems can be used as the source of laser energy.

Figure 21:
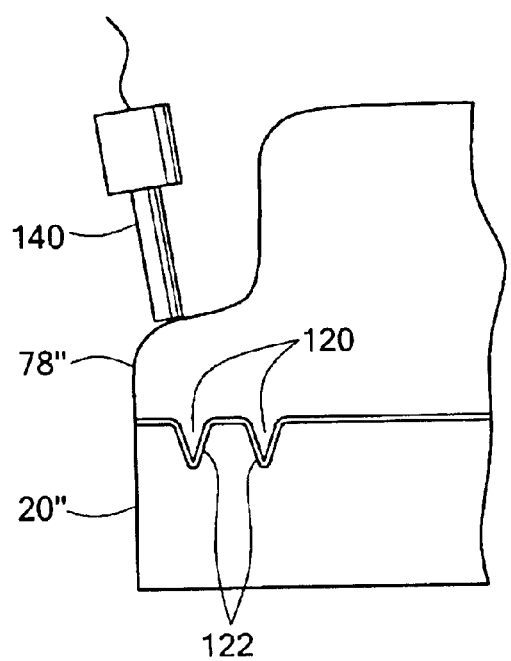
FIG. 21 is a schematic partial cross-sectional view showing still another method of sealing a cover to a substrate in accordance with the subject invention.

In still another example, lower lip 70', FIG. 21 of the cover includes energy directing prongs 120 which are received in cavities 122 formed in substrate 20'. An ultrasonic horn 140 is used to create heat at the interface between lower lip 70' and substrate 20'. Energy directors 120 are integrated into the lid design to focus the ultrasonic energy in order to induce melting at the interface and provide a hermetic seal.

Figure 22:
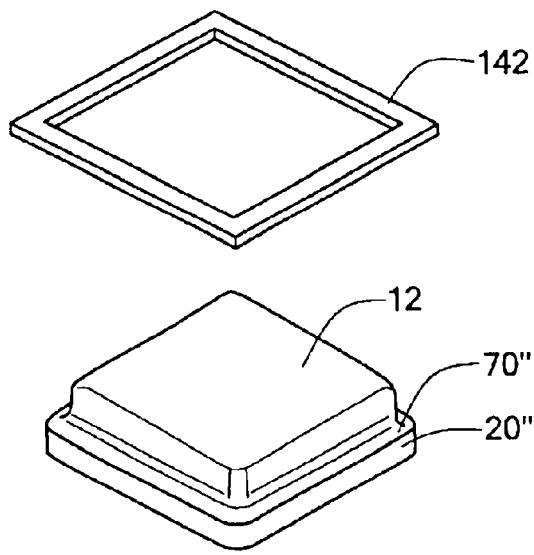
FIG. 22 is a schematic view showing a frame-shaped ultrasonic horn useful in connection with the subject invention for ultrasonically sealing a cover to a substrate.

In FIG. 22 a plunge welding type ultrasonic welding system is used with frame shaped horn 142 which engages all four sides of lower lip 70 of the cover simultaneously to hermetically seal cover 12 to substrate 20 in a single operation.

Figure 23:
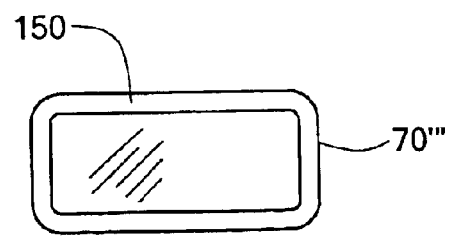
FIG. 23 is a bottom view of a single cover including a metallization layer in accordance with one embodiment of the subject invention.

Finally, soldering as a sealing method can be used if LCP lip 70" or the entire cover, FIG. 23 is metallized on the bottom thereof at sealing interface 150 and if the substrate, not shown, also includes metallization which mates with the lip of the cover.

The result is a hermetically sealed package and an efficient, scalable assembly process reducing time, effort, and cost. Depending on the size of the component(s), panel level assembly as described herein can increase the manufacturing efficiency by an estimated 50% or more. Typically, the package lid assembly is manufactured by injection molding. The printed circuit board may be manufactured with a footprint for package sealing and precision alignment holes for aligned mating. The board is populated with the various components which may be electrical, optoelectronic, and the like and then the panel of package lids is mated with the component substrate. The panel lid assembly is locked to the substrate to maintain alignment and then each cover is sealed before or after singulation of the packages. The alignment and locking method described above is one of many possible mechanisms. Alternatives include, but are not limited to, alignment fiducials formed out of etched metal, screened on chemistries, drilled, and deposited metal. These alignment fiducials will be located on both the substrate and the mating lid. As for the alignment pins, in addition to a straight pin that is ultrasonically melted to secure the assembly, a snap-fit alignment pin may also be implemented. The preferred substrate is composed of at least one layer of biaxially or multiaxially oriented LCP film and bond areas for silicon dice, integrated circuits, MEMs, MOEMs, or a variety of electronic or optoelectronic components that require packaging. One advantage of the subject invention is passive alignment via the alignment holes and the alignment pins. The dimensional stability of the package lids and the dimensional stability the circuit board are tight enough to eliminate the need for special alignment methods for panel level assembly. Passive alignment is especially important in the optoelectronic component arena, but may be useful for multimode applications where the tolerances are on the order of microns, rather than nanometers (singlemode fibers). When a component includes a glass window, a lens array, or other optical devices that require aligned mating, passive alignment within a few microns is achieved and the subject invention saves significant manufacturing time and money.

Figure 24:
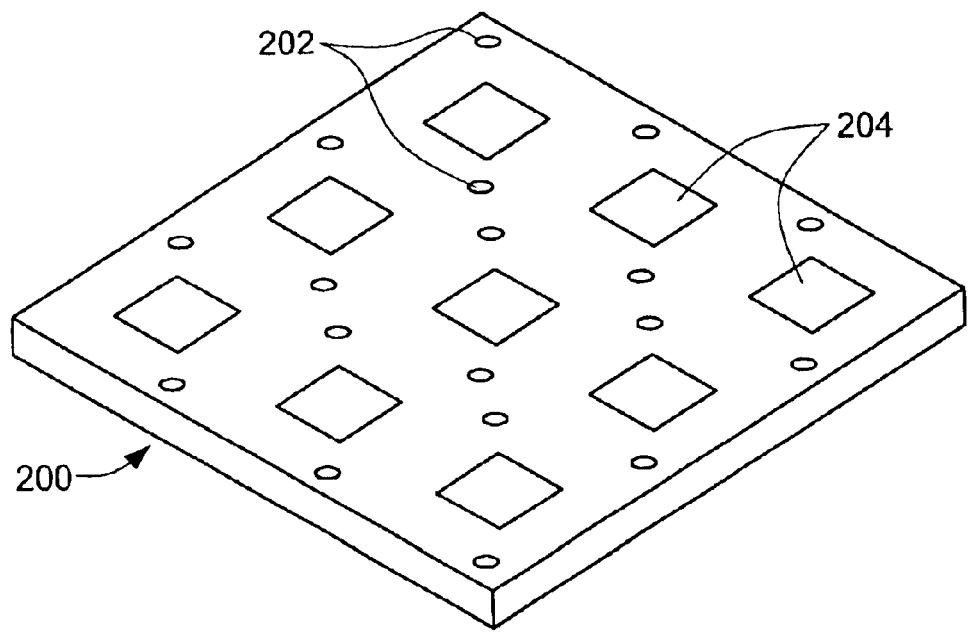
FIGS. 24–29 are schematic views showing the steps involved in packaging electronic components in accordance with this invention and also showing another embodiment of the lid assembly in accordance with this invention.
Figure 25:
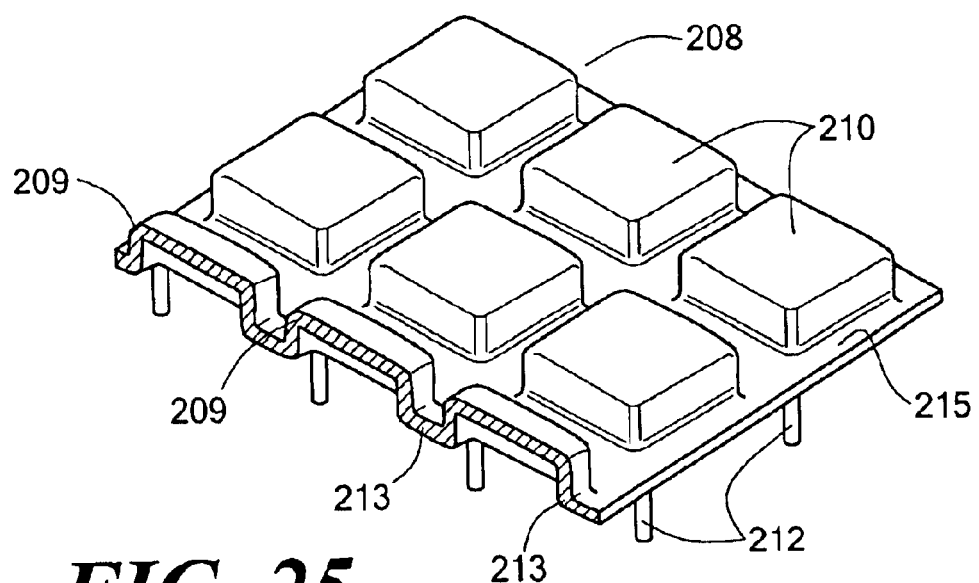
Figure 26:
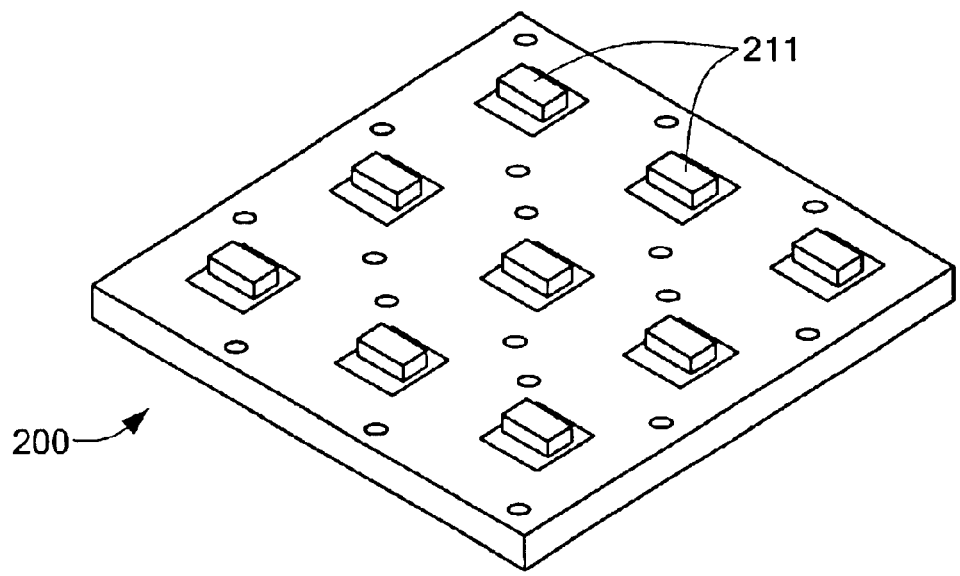
Figure 27:
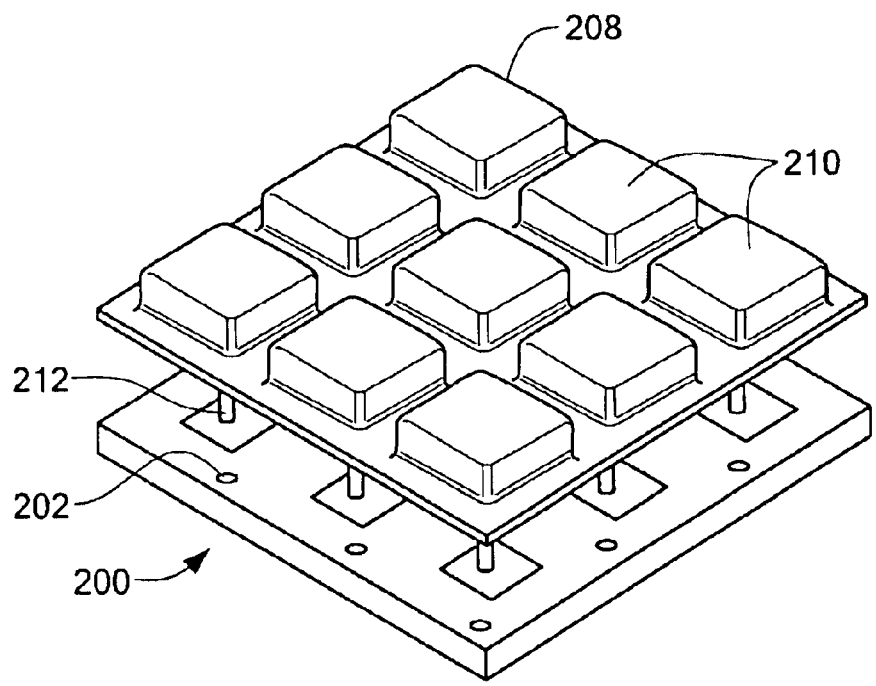
Figure 28:
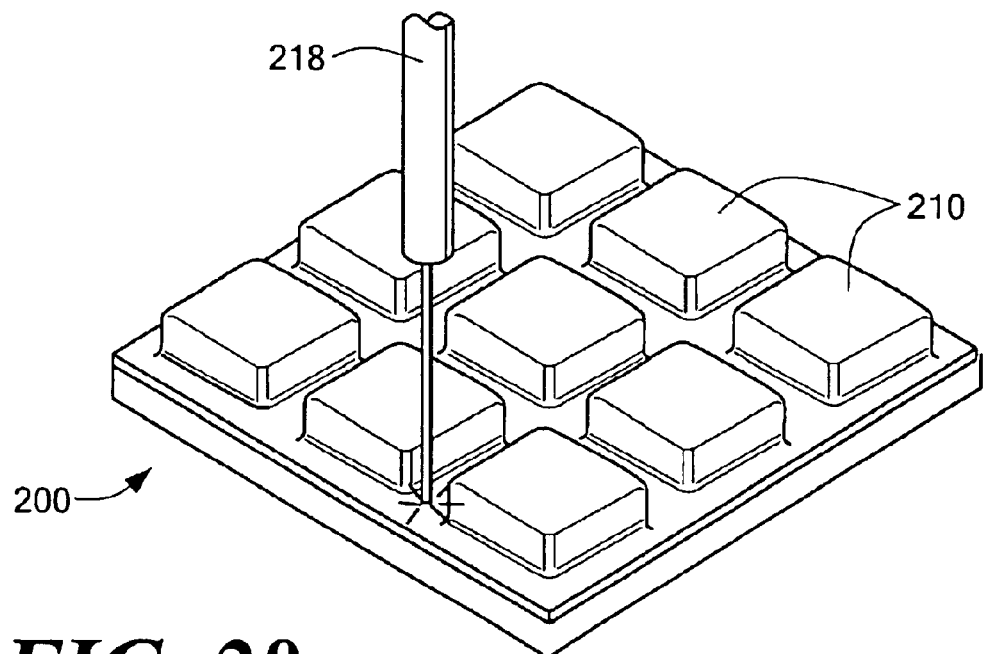
Figure 29:
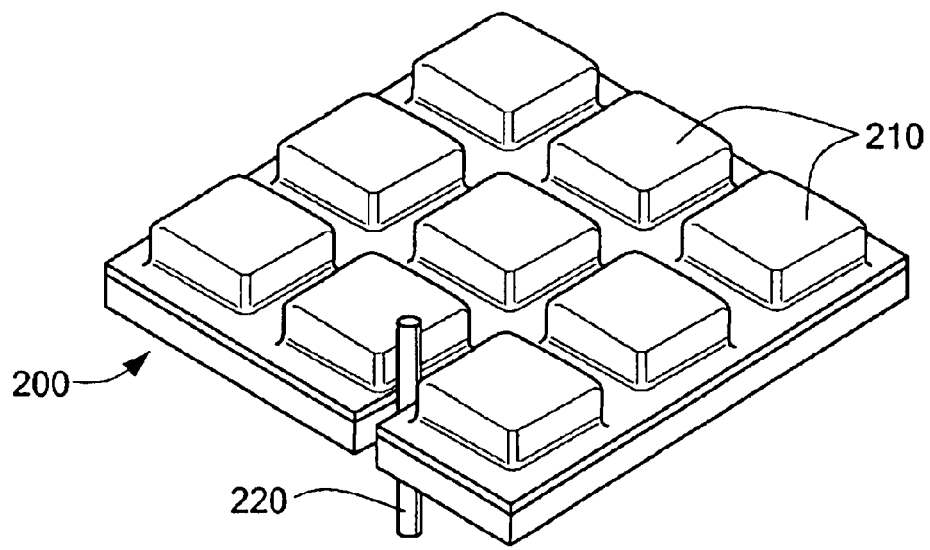

FIGS. 24–29 illustrate one possible packaging technique in accordance with the subject invention. LCP substrate 200 FIG. 24 is biaxial or multiaxial or includes layers of uniaxial LCP cross-plied. Alignment holes 202 are formed in at least the top layer of substrate 200. Areas 204 receive the various components. Molded LCP assembly 208, FIG. 25 includes integrated covers 210 and alignment pins 212. This embodiment, each cover includes sidewalls 209 terminating in lip 213. The lips of all covers are co-joined by interconnecting layer 215. After substrate 200 is populated with components 211 as shown in FIG. 26, lid assembly 208, FIG. 27 is mated with substrate 200 as alignment pins 212 are received in alignment holes 202. Laser 218, FIG. 28 is the used to seal all individual covers 210 to substrate 200. Singulate is the accomplished as shown in FIG. 24 using router 220. The result is individual packages as discussed above.

Figure 30:
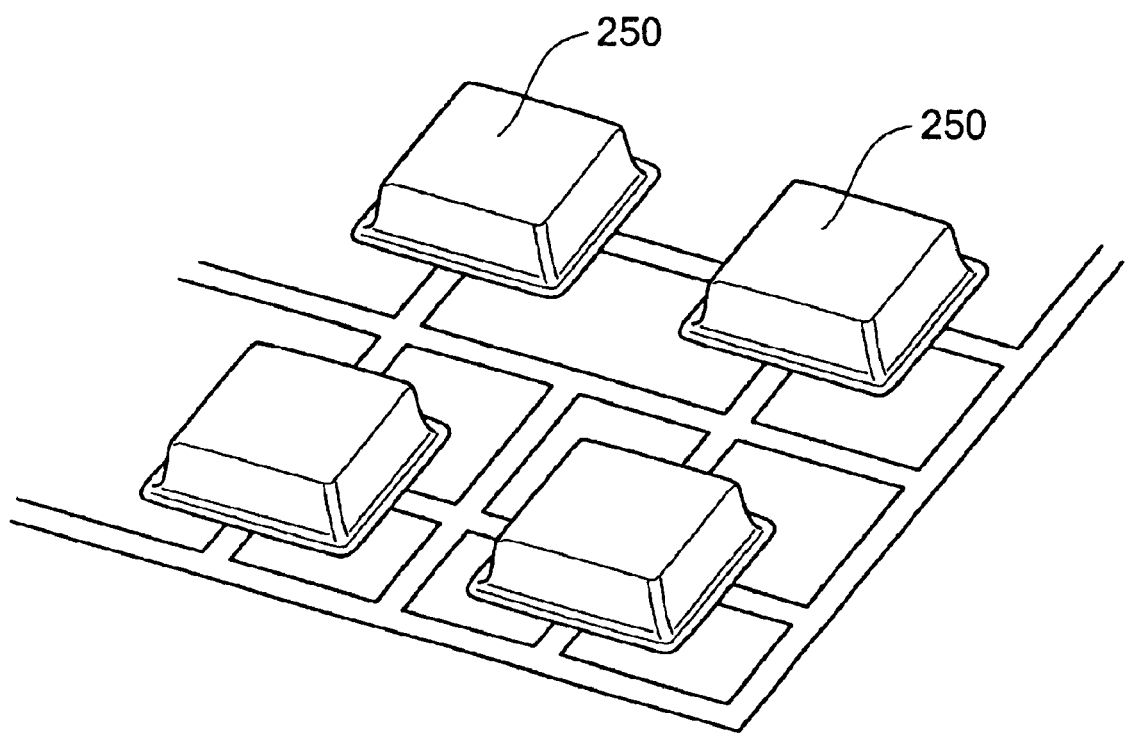
FIG. 30 is a schematic view showing still another lid assembly embodiment in accordance with the invention.

FIG. 30 shows another embodiment of an array of LCP covers 250 interconnected by runners 252 which, during singulation, can be broken or cut.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A package comprising:
    a substrate;
    a plurality of components on the substrate; and
    a lid assembly including a plurality of integrated covers for at least select components on the substrate.

2. The package of claim 1 in which the lid assembly includes a plurality of integral alignment pins and the substrate includes alignment holes which receive the alignment pins to position the covers with respect to the components.

3. The package of claim 2 in which the pins are made of meltable material.

4. The package of claim 2 in which the covers are spaced from each other and the alignment pins are positioned in the spaces between the covers.

5. The package of claim 1 in which the substrate is formed of at least one layer of a liquid crystal polymer material.

6. The package of claim 5 in which the liquid crystal polymer material is bi-axially oriented.

7. The package of claim 1 in which the substrate is a printed circuit board.

8. The package of claim 1 in which there is a cover for each component on the substrate.

9. The package of claim 1 in which the covers are formed in an array and extend outward from an interconnecting layer.

10. The package of claim 1 in which the lid assembly is formed of a liquid crystal polymer material.

11. The package of claim 1 further including a seal between each cover and the substrate.

12. The package of claim 11 in which the seal is a laser welded seal.

13. The package of claim 11 in which the seal is an ultrasonically created seal.

14. The package of claim 1 further including a susceptor material between the covers and the substrate to absorb laser energy when the covers are laser welded to the substrate.

15. The package of claim 1 in which the substrate includes pigmentation to absorb laser energy when the covers are laser welded to the substrate.

16. The package of claim 1 in which the covers include pigmentation to absorb laser energy when the covers are laser welded to the substrate.

17. The package of claim 1 in which the covers include energy directors for focusing ultrasonic energy when the covers are ultrasonically welded to the substrate.

18. The package of claim 17 in which the substrate includes cavities formed therein which received the energy directors of the covers.

19. The package of claim 1 in which each cover includes sidewalls and a cap.

20. The package of claim 19 in which there are four sidewalls.

21. The package of claim 19 in which the lid assembly further includes a layer interconnecting the caps of each cover which can be removed to singulate the individual covers.

22. The package of claim 19 in which the cap includes an optical window.

23. The package of claim 22 in which the optical window is laser sealed to the cap.

24. The package of claim 19 in which the sidewalls include a lower lip.

25. The package of claim 1 in which each cover includes sidewalls each terminating in a lip, the lips co-joined by an interconnecting layer.

26. A lid assembly comprising:
a plurality of covers each including sidewalls and a cap; and
an interconnecting layer which integrates the covers for placement in unison over components on a substrate.

27. The lid assembly of claim 26 in which the covers and the interconnecting layer are formed of a liquid crystal polymer material.

28. The lid assembly of claim 27 in which the covers and the interconnecting layer are injection molded from a liquid crystal polymer material.

29. The lid assembly of claim 26 in which the interconnecting layer is a continuous layer spanning the caps of all the covers.

30. The lid assembly of claim 26 further including a plurality of alignment pins extending outward from the interconnecting layer for aligning the covers with respect to the components.

31. The lid assembly of claim 26 in which the pins are made of meltable material.

32. The lid assembly of claim 26 in which the covers are spaced from each other and the alignment pins are positioned in the spaces between the covers.

33. The lid assembly of claim 26 in which each cover includes four sidewalls extending from a cap.

34. The lid assembly of claim 33 in which the cap includes an optical window.

35. The lid assembly of claim 34 in which the optical window is sealed by a laser to the cap.

36. The lid assembly of claim 30 in which the sidewalls include a lower lip portion.

37. The lid assembly of claim 36 in which the sidewalls include a lower lip portion and the interconnecting layer co-joins the lower lip portions of the covers.

38. A package comprising:
a substrate made of LCP material;
a plurality of components on the substrate; and
a lid assembly including a plurality of integrated covers all made of LCP material and secured to the substrate, each cover disposed over a component.

39. A package comprising:
a substrate;
a plurality of components on the substrate; and
a lid assembly including a plurality of integrated covers extending outward from an interconnecting layer for at least select components on the substrate.

40. A package comprising:
a substrate including alignment holes;
a plurality of components on the substrate; and
a lid assembly including a plurality of integrated covers for at least select components on the substrate and further including a plurality of integral alignment pins received in the alignment holes to position the covers with respect to the components.

41. A package comprising:
a printed circuit board substrate;
a plurality of components on the substrate; and
a lid assembly including a plurality of integrated covers for at least select components on the substrate.

42. A package comprising:
a substrate;
a plurality of components on the substrate; and
a lid assembly including a plurality of integrated covers for each component on the substrate.

43. A package comprising:
a substrate;
a plurality of components on the substrate;
an interconnecting layer; and
a lid assembly including a plurality of integrated covers formed in an array for at least select components on the substrate, said array extending from the interconnecting layer.

44. A package comprising:
a substrate;
a plurality of components on the substrate;
a lid assembly including a plurality of integrated covers for at least select components on the substrate; and
a seal between each integrated cover and the substrate.

45. A package comprising:
a substrate including pigmentation for absorbing laser energy;
a plurality of components on the substrate; and
a lid assembly including a plurality of integrated covers laser welded to the substrate for at least select components on the substrate.

46. A package comprising:
a substrate;
a plurality of components on the substrate; and
a lid assembly including a plurality of integrated covers for at least select components on the substrate, said covers include pigmentation to absorb laser energy when the covers are laser welded to the substrate.

47. A package comprising:

a substrate;

a plurality of components on the substrate; and a lid assembly including a plurality of integrated covers for at least select components on the substrate, the covers including energy directors for focusing ultrasonic energy when the covers are ultrasonically welded to the substrate.

48. A package comprising:

a substrate;

a plurality of components on the substrate;

a lid assembly including a plurality of integrated covers for at least select components on the substrate, each integrated cover including sidewalls each terminating in a lip; and an interconnecting layer co-joining the lips.

* * * * *